(12) United States Patent
Nechay et al.

(10) Patent No.: US 9,773,897 B2
(45) Date of Patent: Sep. 26, 2017

(54) MULTICHANNEL DEVICES WITH GATE STRUCTURES TO INCREASE BREAKDOWN VOLTAGE

(71) Applicants: Bettina A. Nechay, Laurei, MD (US); Robert S. Howell, Silver Spring, MD (US); Eric J. Stewart, Silver Spring, MD (US); Howell George Henry, Ellicott City, MD (US); Justin Andrew Parke, Ellicott City, MD (US); Ronald G. Freitag, Catonsville, MD (US)

(72) Inventors: Bettina A. Nechay, Laurei, MD (US); Robert S. Howell, Silver Spring, MD (US); Eric J. Stewart, Silver Spring, MD (US); Howell George Henry, Ellicott City, MD (US); Justin Andrew Parke, Ellicott City, MD (US); Ronald G. Freitag, Catonsville, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/676,285

(22) Filed: Apr. 1, 2015

(65) Prior Publication Data

US 2016/0293713 A1    Oct. 6, 2016

(51) Int. Cl.
| | |
|---|---|
| *H01L 29/02* | (2006.01) |
| *H01L 29/10* | (2006.01) |
| *H01L 29/778* | (2006.01) |
| *H01L 29/78* | (2006.01) |
| *H01L 29/423* | (2006.01) |
| *H01L 29/40* | (2006.01) |
| *H01L 29/20* | (2006.01) |

(52) U.S. Cl.
CPC ...... *H01L 29/7783* (2013.01); *H01L 29/1054* (2013.01); *H01L 29/404* (2013.01); *H01L 29/42364* (2013.01); *H01L 29/7851* (2013.01); *H01L 29/2003* (2013.01); *H01L 29/4236* (2013.01)

(58) Field of Classification Search
CPC ......... H01L 29/42392; H01L 29/78681; H01L 29/78696
USPC ........................................................ 257/410
See application file for complete search history.

(56) References Cited

U.S. PATENT DOCUMENTS

| | | | | |
|---|---|---|---|---|
| 4,583,107 A | * | 4/1986 | Clarke | .................. H01L 29/812 257/281 |
| 2011/0297961 A1 | * | 12/2011 | Bunin | ............... H01L 29/42316 257/76 |

(Continued)

*Primary Examiner* — Jonathan Han
(74) *Attorney, Agent, or Firm* — Tarolli, Sundheim, Covell & Tummino LLP (57) ABSTRACT

A transistor device is provided that includes a base structure and a superlattice structure that overlies the base structure. The superlattice structure comprises a multichannel ridge having sides that extend to the base structure. The multichannel ridge comprises a plurality of heterostructures that each form a channel of the multichannel ridge. A three-sided gate configuration is provided that wraps around and substantially surrounds the top and sides of the multichannel ridge along at least a portion of its depth. The three-sided gate configuration is configured to re-distribute peak electric fields along the three-sided gate configuration to facilitate the increase in breakdown voltage of the transistor device.

20 Claims, 5 Drawing Sheets

(56) References Cited

U.S. PATENT DOCUMENTS

| | | | |
|---|---|---|---|
| 2014/0264273 A1* | 9/2014 | Howell | H01L 29/7784 257/20 |
| 2015/0054078 A1* | 2/2015 | Xie | H01L 29/785 257/347 |
| 2015/0123215 A1* | 5/2015 | Obradovic | H01L 29/42392 257/410 |

* cited by examiner

MULTICHANNEL DEVICES WITH GATE STRUCTURES TO INCREASE BREAKDOWN VOLTAGE

TECHNICAL FIELD

The present invention relates generally to electronics, and more particularly to multichannel devices with gate structures to increase breakdown voltage.

BACKGROUND

Certain heterostructure materials, such as Aluminum Gallium Nitride (AlGaN) and GaN, create an electron well (i.e., a sheet of electrons) at the interface between the two dissimilar materials resulting from the piezoelectric effect and spontaneous polarization effect therebetween. The resulting sheet of electrons that forms at this interface are typically referred to as a Two-Dimensional Electron Gas ("2DEG") channel or two-dimensional hole gas ("2DHG") channels. Both types of structures can be referred to as "2D×G channel(s)" devices. FETs that operate by generating and controlling the electrons in the 2D×G channel are conventionally referred to as high electron mobility transistors ("HEMTs").

By stacking a plurality of these two-material heterostructures, and with the addition of appropriate doping in the layers to maintain the presence of the 2D×G channels when stacking a plurality of heterostructure layers, the electron sheets are able to act in parallel, allowing for greater current flow through the superlattice device. When this type of FET is "on", the superlattice device has a lower on-resistance, relative to a single heterostructure-layer device, because the multiple 2DEG channels allow a proportionally higher current to flow between the source and drain, resulting in an overall reduction in on-resistance. This type of structure has been well suited for providing an ultra low channel resistance high frequency switch.

Due to difficulties in pinching off field effect transistors (FETs), having channels formed from superlattice structures, from the top of the multichannel device, the epitaxial region is instead etched into to form ridges that are pinched off via a gate contact from the sides. Due to limits imposed on both ridge width and sidewall slope by fabrication techniques, these FETs tend to show significantly higher pinch-off voltages and higher induced electric fields than do most standard, single channel, top pinching FETs. Specifically, for top pinching standard FETs, the gate is very close to the channel, thus allowing small pinch-off voltages, and higher breakdown voltages. However, for sidewall gates pinching-off etched ridges, distances from gate to the center of the ridge is much larger significantly increasing the necessary pinch-off voltage and increasing the resulting induced electric fields. This increase in the resulting induced electric fields contributes to a lower breakdown voltage than a similar top pinching FET.

SUMMARY

In accordance with an example, a transistor device is provided that includes a base structure and a superlattice structure that overlies the base structure. The superlattice structure comprises a multichannel ridge having sides that extend to the base structure. The multichannel ridge comprises a plurality of heterostructures that each form a channel of the multichannel ridge. A three-sided gate configuration is provided that wraps around and substantially surrounds the top and sides of the multichannel ridge along at least a portion of its depth. The three-sided gate configuration is configured to re-distribute peak electric fields along the three-sided gate configuration to facilitate the increase in breakdown voltage of the transistor device.

In one example, the three sided gate configuration comprises a plurality of gate contacts that wrap around and substantially surround the top and sides of the multichannel ridge along at least a portion of its depth. The plurality of gate contacts run parallel to one another. The peak electric fields are configured to re-distribute across each of the plurality of gate contacts to facilitate the increase in breakdown voltage of the transistor device.

In another example, the three sided gate configuration comprises a gate contact that wraps around and substantially surrounds the top and sides of the multichannel ridge along at least a portion of its depth. The gate contact comprises side field-plates along at least one of a first side and a second side of the multichannel ridge. The side field-plates redistribute the peak electric fields across the gate to portions of the side field-plates to increase the breakdown voltage of the transistor.

In yet a further example, the three sided gate configuration comprises a dielectric layer that wraps around and substantially surrounds the top and sides of the multichannel ridge along at least a portion of its depth. A gate contact wraps around and substantially surrounds the top and sides of the dielectric layer. The dielectric layer is thick enough on the sides of the multichannel ridge to absorb at least a portion of the peak electric fields that are normally absorbed by the multichannel ridge.

DETAILED DESCRIPTION

Multichannel devices are disclosed with gate structures configured to increase multichannel device breakdown voltages. For most FET structures, the highest electric fields within the device occur at the edges of the gate on the drain and source side. The gate structures disclosed herein can either distribute the voltage drops over one or more structures that contribute to breakdown, and/or provide specific structures that can tolerate and absorb higher breakdown fields.

In specific examples, gates are provided that are configured to improve the breakdown voltage of super-lattice castellated gate heterojunction field effect transistors (SLCFET). The SLCFET is a revolutionary solid-state RF switch technology that offers 2-3× improvement in on-state resistance vs. conventional technology through the use of stacked semiconductor channels. Though such multi-channel devices offer low on-state resistance, pinch-off voltages and peak electric fields can be very high with such side-pinching structures, such that they are high enough to significantly limit the device breakdown voltage and achievable RF power. These example techniques limit the electric fields experienced by the device near pinch-off, enabling the drain to be driven to higher voltages before breakdown.

Several examples are presented in this disclosure that ameliorate the problems associated with these high electric fields in order to extend the breakdown voltage. In one example, side field-plates are provided that are adjacent to the sidewalls (sides) of laterally pinched-off SLCFETs. This is necessary since standard top-side field plates have little effect on the lower channels of SLCFETs. The sidewall field plate method can act to spread out the voltage drop and depletion at the edges of the gate, reducing the electric fields, which results in an increased breakdown voltage capability. In another example, a multiple gate structure is provided that facilitates the distribution of the drain to source voltage drop over the different gate structures that leads to breakdown. The multiple gate structure spreads the drain-source voltage drop over two sets of gate depletion regions—thus, again, decreasing electric fields and improving breakdown voltage. In yet another example, sidewall dielectric material is provided between the sidewall of multichannel ridges and the sidewall of the gate contact. This results in the highest fields (peak field region) at pinch-off to pass to the sidewall dielectric materials, which can tolerate and absorb higher breakdown fields than the channel.

Although these examples are illustrated with respect to GaN SLCFETs, they are equally applicable to any other material system that can produce multiple channels parallel to the surface, and are equally applicable to any other side-pinching device for such a multi-channel stack device. As an example, a SLCFET structure described herein includes a multichannel device composed of a plurality of aluminum gallium nitride (AlGaN)/gallium nitride (GaN) heterojunction layers of a prescribed thickness and composition, which is known as an AlGaN/GaN superlattice, formed on a single integrated circuit. A 2-dimensional electron gas (2DEG) forms at the interface between the AlGaN and GaN layers resulting in high electron mobility. Equally applicable is a superlattice structure having a plurality of two-dimensional hole gas (2DHG) channels. Both types of structures can be referred to as "2D×G channel(s)" devices.

Carriers which form a 2DEG in a standard channel of AlGaN/GaN are spontaneously generated and maintained due to piezoelectric and spontaneous polarization. In this case, the AlGaN barrier is strained by virtue of its epitaxial relationship with the GaN channel and since these materials are piezoelectric, free carriers are generated in the channel.

Although the present example is illustrated with respect to employing a layer of AlGaN overlying a layer of GaN for each heterostructure, a variety of heterostructures could be employed as long as the heterostructure comprises two layers of dissimilar materials designed to create a sheet of electrons (i.e. a 2DEG channel) or a sheet of holes (i.e., a 2DHG channel) at the interface between the two dissimilar materials. Various heterostructure materials are known to produce 2DEG and 2DHG channels at the interface therebetween, including but not limited to Aluminum Gallium Nitride (AlGaN) and Gallium Nitride (GaN), Aluminum Gallium Arsenide (AlGaAs) and Gallium Arsenide (GaAs), Indium Aluminum Nitride (InAlN) and Gallium Nitride (GaN), alloys of Silicon (Si) and Germanium (Ge), and noncentrosymmetric oxidesheterojunction overlying a base structure.

It is to be appreciated that in a single heterostructure, the dissimilar materials cause an imbalance stress in the system which allows polarization and/or piezoelectric effects to induce carriers to form in a potential well formed by the heterostructure, i.e., to create a 2D×G channel. However, in a superlattice structure where multiple heterostructures are stacked on top of each other, all heterostructures beneath the top heterostructure will become balanced and carriers that would otherwise induce in those potential wells will not be induced. Adding a doping layer near the interface where the potential well is formed will act to induce the carriers into that potential well, replacing the effect that would have occurred but for the balancing effect of multiple symmetric heterostructures.

Figure 1:
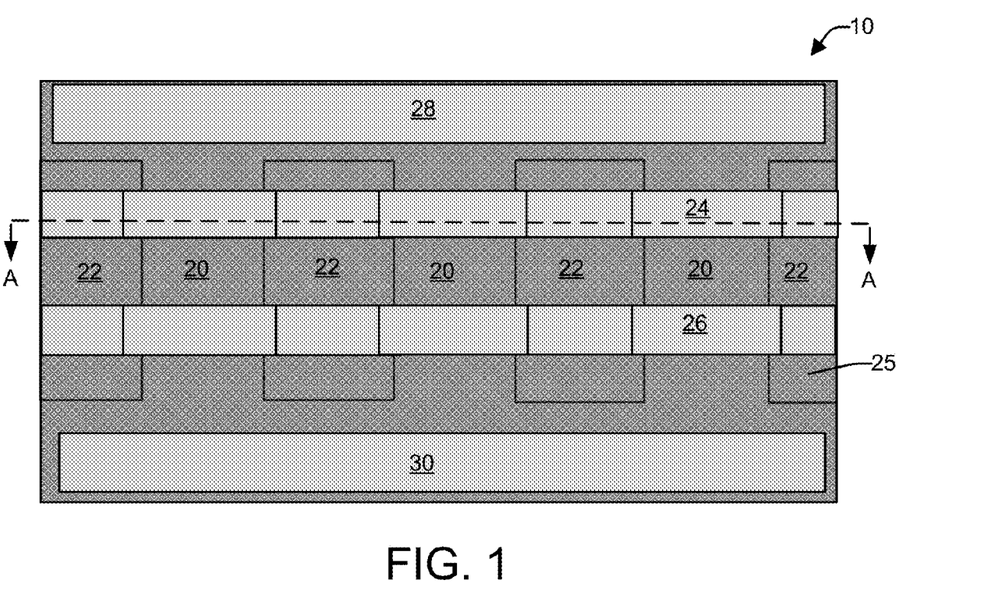
FIG. 1 illustrates a top plan view of an example of a SLCFET device structure.
Figure 2:
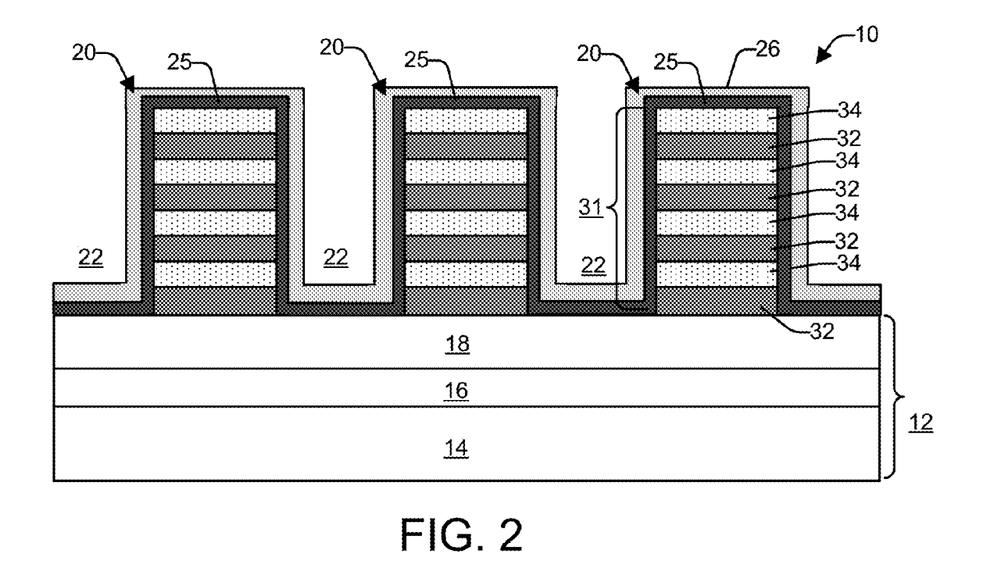
FIG. 2 illustrates a cross-sectional view of the example of the SLCFET device structure of FIG. 1 along the lines A-A.

FIG. 1 illustrates a top plan view of an example of a SLCFET device structure 10 having a dual-gate structure. FIG. 2 illustrates a cross-sectional view of the SLCFET device structure 10 of FIG. 1 along the lines A-A. Although the device 10 is shown with two gate structures, the SLCFET device can be an N-gate structure where N is an integer greater than or equal to two. For example, a three gate structure can be provided that would be suited for facilitating the distribution of electric fields and increasing pinch-off when currents flow from both source to drain and from drain to source. The device structure 10 includes a first castellated gate contact 24 that substantially surrounds three sides of a plurality of superlattice structure ridges (multichannel ridges) 20 formed from plurality of heterostructures of an AlGaN layer overlying a GaN layer, which are connected to one another through non-channel openings 22. The device structure 10 also includes a second castellated gate contact 26 that substantially surrounds three sides of the plurality of superlattice structure ridges (multichannel ridges) 20, which are connected to one another through non-channel openings 22.

A first dielectric layer 25 is disposed between the first castellated gate contact 24 and the plurality of superlattice structure ridges 20, and has a sidewall dielectric of a first thickness. A second dielectric layer (not shown) is disposed between the second castellated gate contact 26 and the plurality of superlattice structure ridges 20, and has a sidewall dielectric of a second thickness that is less than the first thickness. Alternatively, no dielectric layer may exist between the second castellated gate contact 26 and the plurality of superlattice structure ridges 20. By varying the thickness of the of the dielectric layer between the first and second castellated gate contacts 24 and 26, the electric field and thus the voltage drop is distributed across the two gates resulting in an increase in breakdown voltage for the device. It is to be appreciated that the thicker dielectric would be associated with the side that receives the higher voltage in a two castellated gate contact configuration whether it be the source side or drain side of the device structure 10.

Figure 3:
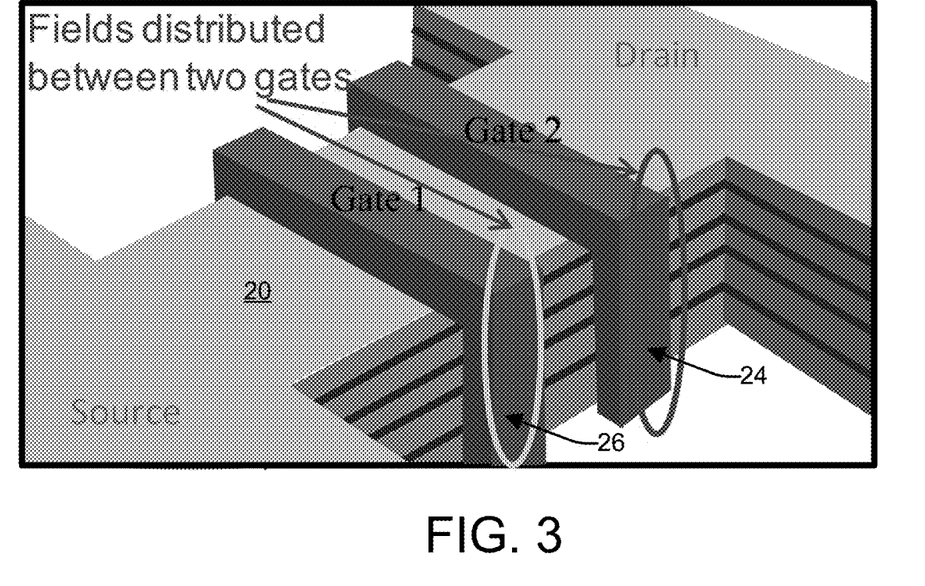
FIG. 3 illustrates a perspective view of a single multi-channel ridge and associated portions of the first and second castellated gate contacts of the SLCFET device.

FIG. 3 illustrates a perspective view of a single multi-channel ridge and associated portions of the first and second castellated gate contacts and of the SLCFET device 10. The sidewall dielectric layer(s) are not shown for the sake of simplicity but would exist as discussed in FIGS. 1-2 to allow for an increase in breakdown voltage. FIG. 3 also shows the distribution of the peak electric fields (indicated by ovals), over the side portions of the both the first and second castellated gate contacts 24 and 26 of the SLCFET device 10. The second castellated gate contact 26 runs parallel with the first castellated gate contact 24 and allows for spreading of the gate-edge depletion regions, thus reducing peak electric fields, and thus distributing the drain-source voltage drop across two gates, which are both biased close to or below pinch-off in the 'OFF' state. The spacing of the gates can be minimized for minimal access region resistance, where the lower limit would be dictated by fabrication limitations. Such a dual gate structure has the advantage of improved breakdown voltage.

Referring again to FIGS. 1-2, the first and the second castellated gate contacts 24 and 26 reside in between a drain ohmic contact 28 and a source ohmic contact 30. A protection layer 25, for example, of silicon nitride (SiN), can overly the entire structure 10. Each superlattice structure ridge 20 includes a plurality of heterostructures 31 that overly a base structure 12. Each heterostructure is formed of an AlGaN layer 34 overlying a GaN layer 32. Each parallel heterostructure forms a portion of a channel of the multi-channel formed from the plurality of superlattice structure ridges 20. In the present example, the drain side has the thicker dielectric, while the source side has the thinner dielectric or no dielectric. However, in a configuration where the source side experiences higher voltages than the drain side, the thicker dielectric would be on the source side and the thinner or no dielectric would be on the drain side.

The base structure 12 can comprise a substrate layer 14, a nucleation layer 16 and a buffer layer 18 of, for example, silicon carbide (SiC), aluminum nitride (AlN) and aluminum gallium nitride (AlGaN), respectively. Optionally, the base structure 12 can comprise a substrate layer 14 of sapphire, a nucleation layer 16 comprising a combination of a low-temperature GaN layer and a high-temperature GaN layer, and a buffer layer 18 based on the material of the superlattice structure to be located thereon, if required. The base structure 12 can alternatively comprise a substrate layer 14 of (111)-orientated crystalline silicon, a nucleation layer 16 comprising AlN and a buffer layer 18 comprising a series of discrete AlGaN layers (typically between two and eight layers), each discrete layer having a different aluminum composition. Other base structures will be apparent to those skilled in the art.

The superlattice structure ridges 20 can comprise a plurality of heterostructures, between 2 and K, wherein K is defined as the maximum number of heterostructures that can be grown, deposited or otherwise formed on each other without cracking or other mechanical failure in the layers or 2DEG channels. As will be appreciated by one skilled in the art, the value of K is a function of the specific heterostructure materials and thickness of each layer. The specific number of heterostructures within the superlattice structure and the heteromaterials can vary, and the relative positions of AlGaN and GaN may be reversed, as will be appreciated by one skilled in the art. By stacking a plurality of these two-material heterostructures, and with the addition of appropriate doping in the layers to maintain the presence of the 2D×G channels when stacking a plurality of heterostructure layers, the electron sheets are able to act in parallel, allowing for greater current flow through the superlattice device.

In another example of gate design for improved breakdown voltage, gate structures with side field-plates can be provided that are adjacent to the sidewalls of laterally pinched-off SLCFETs to increase breakdown voltage as stated above. The sidewall field plates can act to spread out the voltage drop and depletion at the edges of the gate, reducing the electric fields, which results in an increased breakdown voltage capability.

Figure 4:
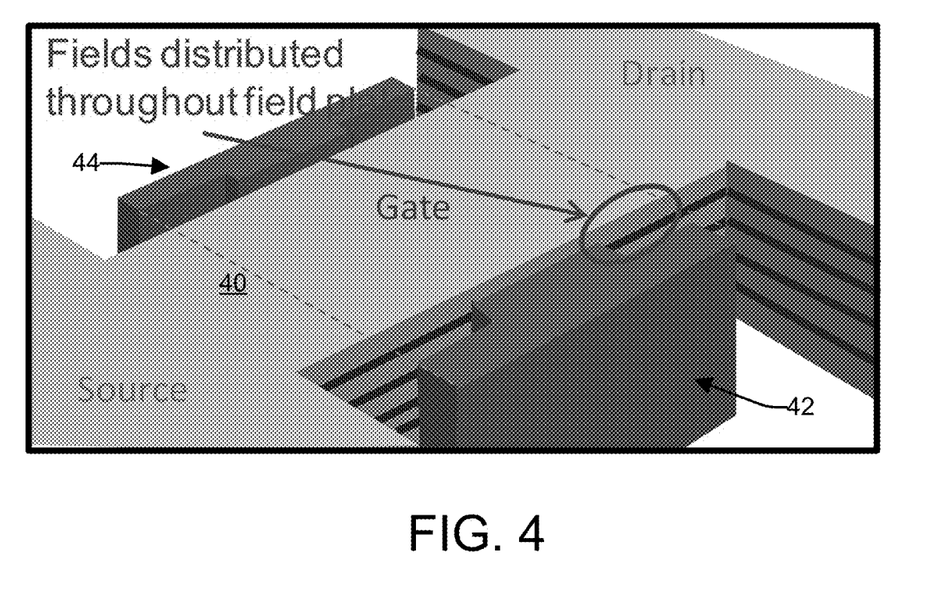
FIG. 4 illustrates a perspective view of a single multi-channel ridge and associated sidewall field plates of a single castellated gate contact of a SLCFET device.

FIG. 4 illustrates a perspective view of a single multi-channel ridge 40 and associated sidewall field plates 42 and 44 of a single castellated gate contact of a SLCFET device. A top portion of the gate contact shown in dashed lines overlying the multi-channel ridge has been removed to provide a clearer view of the associated sidewall field plates 42 and 44. The sidewall field plates 42 and 44 are in proximity to the two-dimensional electron gas (2DEG) of all channels to produce effective reduction of the peak fields at the gate edge. The field plates 42 and 44 in this case consists of gate metal that is extended along the sidewall of the multi-channel ridge separated from the edge of the ridge by a very thin dielectric (not shown), which, for GaN based materials, would typically consist of silicon nitride.

Another possibility for a sidewall field plate is to adapt the concept of a source connected field plate (sometimes referred to as a shield plate) to the sidewall of the multi-channel ridge. That is to extend metal from the source ohmic contact to the sidewall, with a nitride (or other dielectric) gap separating the gate from this source-connected sidewall field plate. Either a sidewall field plate or a sidewall shield plate can reduce the peak fields at the drain (or source) edge of the gate, and thus improve the breakdown voltage.

Figure 5:
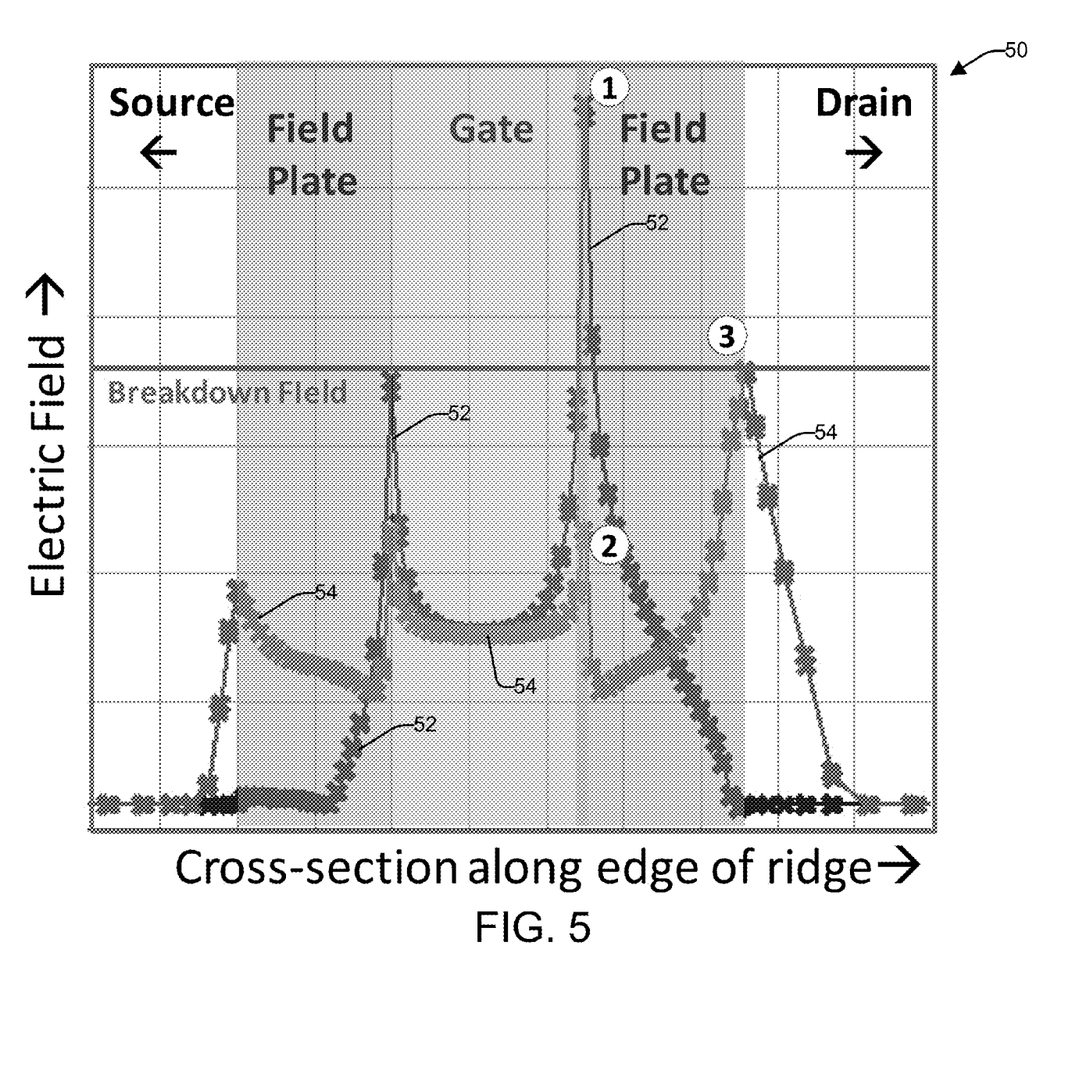
FIG. 5 illustrates a graph of the electrical field strength versus the cross-section along the edge of the ridge from the source through the side field-plates to the drain.

FIG. 5 illustrates a graph 50 of the electrical filed strength versus the cross-section along the edge of the ridge from the source through the side field-plates to the drain generated by Silvaco ATLAS 3D simulations. A first waveform 52 illustrates the electric field along the cross-section of the FET assuming that there was no field plate and that the source and drain occupy the space indicated as field plate. A second waveform 54 illustrates the electric field along the cross-section of the FET assuming that there is a field plate with 50V on the drain and −14V on the gate (common source configurations—i.e. Vs=0V). Without the field plate, the peak fields (1) which are at the drain edge of the gate is far above the breakdown field, whereas with the field plate, the local peak field at the drain edge of the gate is significantly reduced (point 2), such that the overall peak field that now occurs at the drain edge of the field plate is below the breakdown field (3). Therefore, the applied voltage that previously caused breakdown can now be achieved without breakdown, such that the breakdown voltage is increased.

Figure 6:
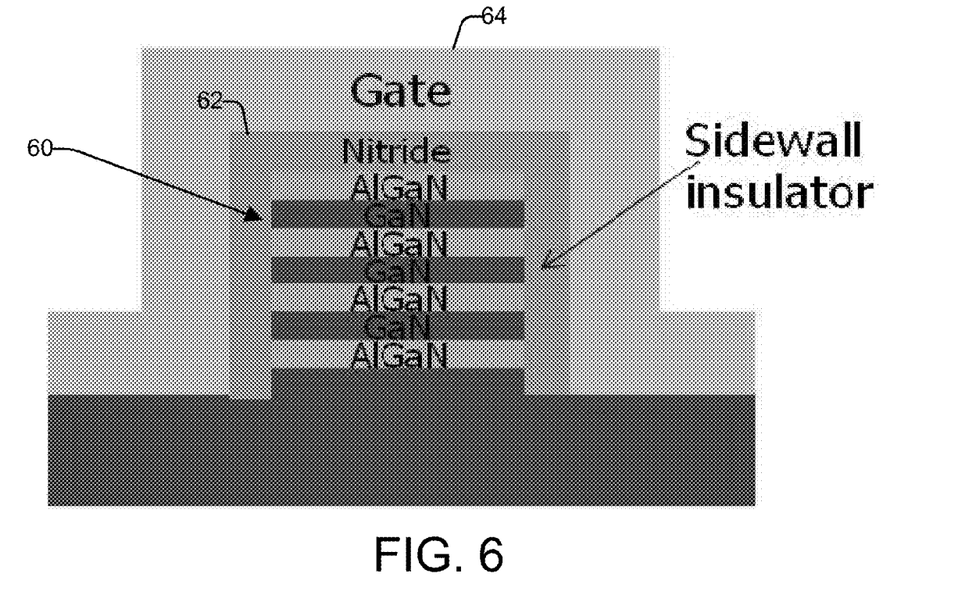
FIG. 6 illustrates a cross-sectional view of a single multi-channel ridge and an associated castellated gate contact of a SLCFET device with a dielectric material layer disposed between sidewalls of the multi-channel ridge and the sidewalls of the gate contact.

Another technique of improving the peak electric fields of such multi-channel FETs, as discussed above, is to surround the ridges with a reasonably thin film of an insulating material, such as silicon nitride that has a significantly higher dielectric breakdown strength. FIG. 6 illustrates a cross-sectional view of a single multi-channel ridge 60 and an associated castellated gate contact 64 of a SLCFET device with a dielectric material layer 62 disposed between sidewalls of the multi-channel ridge 60 and the sidewalls of the gate contact 64. Such a sidewall dielectric 62 has various advantages over a ridge that is not surrounded by such a dielectric layer. Specifically, an advantage is that the peak electric fields are shifted and absorbed from the edge of the semiconductor (ex. AlGaN/GaN) to the surrounding dielectric layer. The dielectric layer can be selected to be thick enough on the sides of the multichannel ridge to absorb at least a portion of the peak electric fields that are normally absorbed by the multichannel ridge. As long as the breakdown strength of the surrounding insulator is significantly higher than that of the semiconductor, there is a net increase in the breakdown voltage of the device. Another advantage of such a surrounding dielectric layer is that it virtually eliminates gate leakage currents due to the high potential barrier between gate and channels, which is a barrier which does not exist for direct gate-to-semiconductor contact.

Figure 7:
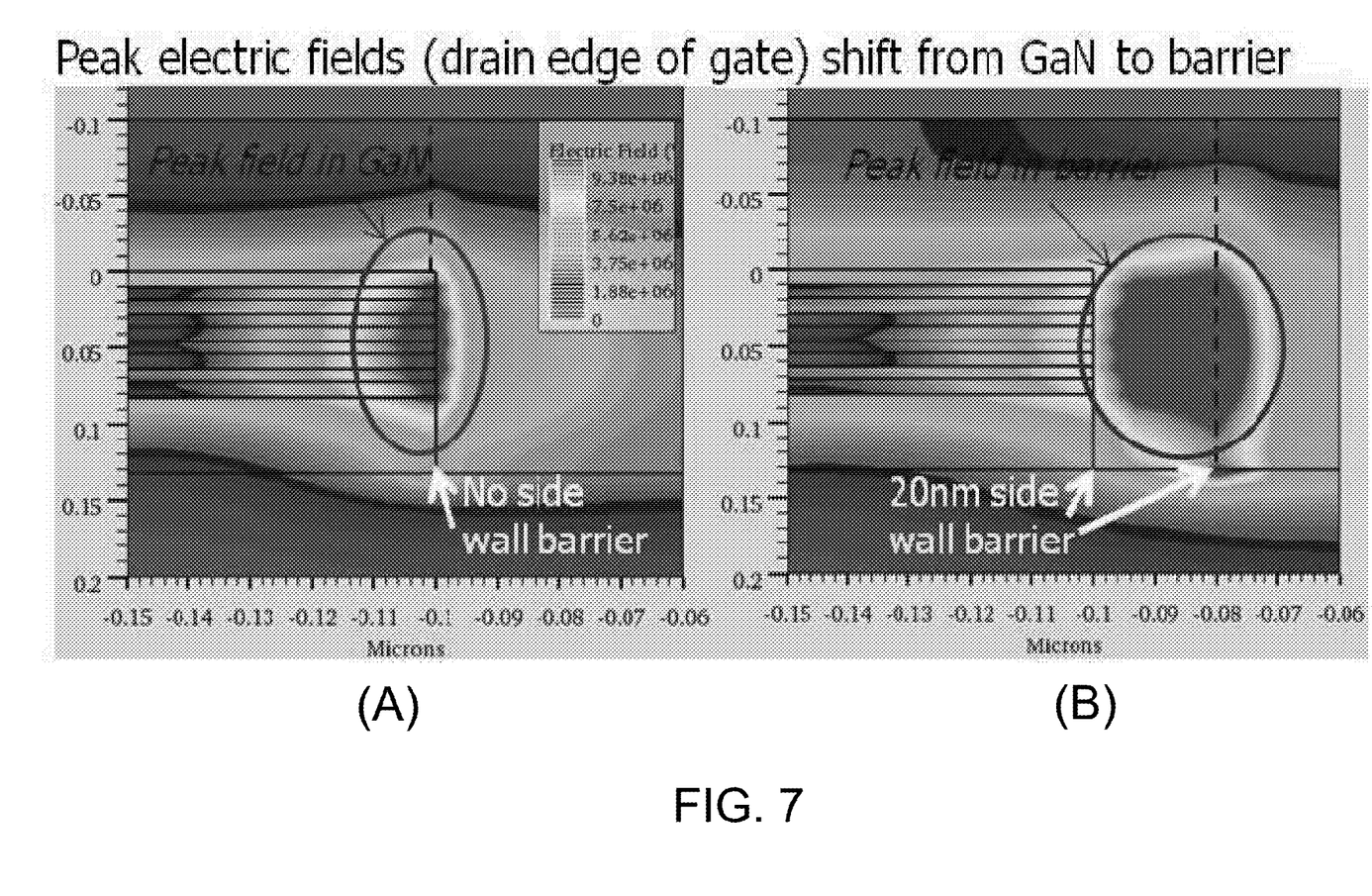
FIG. 7 illustrates graph of electric fields versus distance from the drain edge of the gate for a SLCFET at pinch off voltage ($V_{po}$) without (A) and with (B) a sidewall dielectric layer.

Silvaco ATLAS 3D finite element device simulations were performed to compare the location and magnitude of the peak electric fields for a SLCFET structure with and without a silicon nitride sidewall. FIG. 7 illustrates a graph of simulated electric fields along the width of the ridge at the drain edge of the gate for a SLCFET at pinch off voltage ($V_{po}$) without (A) and with (B) a sidewall dielectric layer, showing the shift of fields from the GaN to the sidewall nitride. As can be seen in FIG. 7, when sidewall dielectric is added, the peak electric fields reduce for the semiconductor (ex. GaN) and shift to the sidewall dielectric layer, which should be a material with a much higher breakdown field. Such a structure can then tolerate higher electric fields, which translates to improved breakdown voltage.

Figure 8:
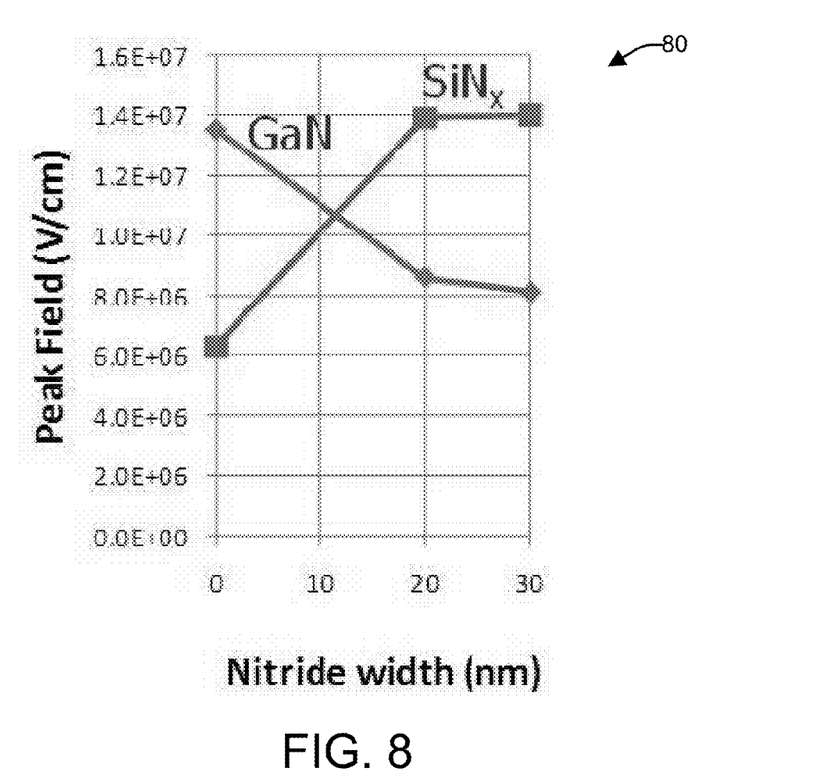
FIG. 8 illustrates a graph of peak electric fields in the GaN as a function of sidewall nitride thickness.

FIG. 8 illustrates a graph 80 of peak electric fields in the GaN as a function of sidewall nitride thickness. As illustrated in FIG. 8, the peak electric fields shift from the GaN to the sidewall nitride, which can tolerate the larger fields, allowing for even larger electric fields to be applied and, thus, allowing for increased breakdown voltage.

Further, although the previous examples are illustrated as a specific gate configuration, the techniques can be employed alone or in combination with one another. Additionally, one skilled in the art will appreciate that the techniques can be employed to handle fields as a result of current and voltages flowing from the drain to source in addition to current and voltages flowing from the source to drain.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:
1. A transistor device comprising:
a base structure;
a superlattice structure overlying the base structure and comprising a multichannel ridge having sides that extend to the base structure, the multichannel ridge comprising a plurality of heterostructures that each form a channel of the multichannel ridge; and
a three-sided gate configuration that wraps around and substantially surrounds a top and sides of the multichannel ridge along at least a portion of its depth, the three-sided gate configuration being configured to re-distribute peak electric fields along the three-sided gate configuration to facilitate the increase in breakdown voltage of the transistor device.
2. The transistor of claim 1, wherein the three-sided gate configuration comprises a plurality of gate contacts that wrap around and substantially surround the top and sides of the multichannel ridge along at least a portion of its depth, and run parallel to one another, wherein at least one of the gate contacts has a dielectric side layer with a thickness that is different than a thickness of a dielectric side layer of another gate contact.
3. The transistor of claim 1, wherein the three-sided gate configuration comprises a gate contact that wraps around and substantially surround the top and sides of the multichannel ridge along at least a portion of its depth, the gate contact comprising side field-plates along at least one of a first side and a second side of the multichannel ridge.
4. The transistor of claim 1, wherein the three-sided gate configuration comprises a dielectric layer that wraps around and substantially surrounds the top and sides of the multichannel ridge along at least a portion of its depth, and a gate contact that wraps around and substantially surrounds the top and sides of the dielectric layer.
5. The transistor of claim 4, wherein the dielectric layer is thick enough on the sides of the multichannel ridge to absorb at least a portion of the peak electric fields that are normally absorbed by the multichannel ridge.
6. The transistor of claim 1, wherein each heterostructure is formed from an AlGaN layer and a GaN layer, wherein the AlGaN layer is doped.
7. The transistor of claim 1, further comprising a plurality of multichannel ridges spaced apart from one another by non-channel openings and comprising a plurality of heterostructures that each form a portion of a parallel channel of the transistor.
8. The transistor of claim 1, wherein the transistor is a super-lattice castellated gate heterojunction field effect transistor (SLCFET).
9. The transistor of claim 1, further comprising:
a source disposed on a first end of the superlattice structure; and
a drain disposed on a second end of the superlattice structure, wherein the three-sided gate configuration is disposed in between the source and the drain.
10. A transistor comprising:
a base structure;
a superlattice structure overlying the base structure and comprising a plurality of multichannel ridges having sides that extend to the base structure and being spaced apart from each other by non-channel openings, each of the plurality of multichannel ridges comprising a plurality of heterostructures that each form a portion of a channel of the transistor;
a source disposed on a first end of the superlattice structure;
a drain disposed on a second end of the superlattice structure; and
a plurality of gate contacts disposed in between the source and the drain, the plurality of gate contacts each wrap around and substantially surround a top and sides of the multichannel ridge along at least a portion of its depth, and run parallel to one another, wherein the peak electric fields are configured to re-distribute across each of the plurality of gate contacts to facilitate the increase in breakdown voltage of the transistor device.
11. The transistor of claim 10, wherein each of the plurality of gate contacts comprise side field-plates along at least one of a first side and a second side of at least one of the multichannel ridges.
12. The transistor of claim 10, further comprising a dielectric layer that wraps around and substantially surrounds at least the sides of each of the multichannel ridges and is disposed between at least one of the plurality of gate contacts and the multichannel ridges, wherein a dielectric side layer thickness of the at least one contact is different than a thickness of a dielectric side layer of another gate contact.

13. The transistor of claim 12, wherein the dielectric layer is thick enough on the sides of the multichannel ridge to absorb at least a portion of the peak electric fields that are normally absorbed by the multichannel ridge.

14. A transistor comprising:
a base structure;
a superlattice structure overlying the base structure and comprising a plurality of multichannel ridges having sides that extend to the base structure and being spaced apart from each other by non-channel openings, each of the plurality of multichannel ridges comprising a plurality of heterostructures that each form a portion of a channel of the transistor;
a source disposed on a first end of the superlattice structure;
a drain disposed on a second end of the superlattice structure; and
a gate contact disposed in between the source and the drain, the gate contact wrapping around and substantially surrounding a top and sides of the multichannel ridge along at least a portion of its depth, the gate contact having side field-plates along at least one of a first side and a second side of each one of the multichannel ridges.

15. The transistor of claim 14, further comprising at least one additional gate contact that wraps around and substantially surrounds the top and sides of the multichannel ridge along at least a portion of its depth, and runs parallel to the gate contact, wherein the peak electric fields are configured to re-distribute across the gate contact and the at least one additional contact to facilitate the increase in breakdown voltage of the transistor device.

16. The transistor of claim 14, further comprising a dielectric layer that wraps around and substantially surrounds at least the sides of each of the multichannel ridges and is disposed between the gate contact and the multichannel ridges.

17. The transistor of claim 16, wherein the dielectric layer is thick enough on the sides to absorb at least portions of the peak electric fields that are normally absorbed by the multichannel ridge.

18. A transistor comprising:
a base structure;
a superlattice structure overlying the base structure and comprising a plurality of multichannel ridges having sides that extend to the base structure and being spaced apart from each other by non-channel openings, each of the plurality of multichannel ridges comprising a plurality of heterostructures that each form a portion of a channel of the transistor;
a source disposed on a first end of the superlattice structure;
a drain disposed on a second end of the superlattice structure; and
a dielectric layer that wraps around and substantially surrounds a top and sides of each of the plurality of multichannel ridges along at least a portion of its depth; and
a gate contact that wraps around and substantially surrounds the top and sides of the dielectric layer, wherein the dielectric layer is thick enough on the sides of the multichannel ridges to absorb at least portions of the peak electric fields that are normally absorbed by the multichannel ridges.

19. The transistor of claim 18, further comprising at least one additional gate contact that wraps around and substantially surrounds the top and sides of the multichannel ridge along at least a portion of its depth, and runs parallel to the gate contact, wherein the peak electric fields are configured to re-distribute across the gate contact and the at least one additional contact to facilitate the increase in breakdown voltage of the transistor device.

20. The transistor of claim 19, wherein the three-sided gate configuration comprises a gate contact that wraps around and substantially surrounds the top and sides of the multichannel ridge along at least a portion of its depth, the gate contact comprising side field-plates along at least one of a first side and a second side of the multichannel ridges.

* * * * *